(12) United States Patent  
Lipson et al.

(10) Patent No.: US 8,953,160 B2  
(45) Date of Patent: Feb. 10, 2015

(54) SYSTEMS HAVING A REFLECTED LIGHT SENSOR AND METHODS OF USE

(75) Inventors: Jan Lipson, Cupertino, CA (US); Donald A. Ice, Milpitas, CA (US); Rudolf J. Hofmeister, San Jose, CA (US); Yuxin Zhou, Fremont, CA (US); Harold G. Sampson, Sunnyvale, CA (US); Qingfeng Huang, San Jose, CA (US); James Stewart, San Mateo, CA (US); Janyce Lipson, legal representative, Cupertino, CA (US)

(73) Assignee: Redox Biomedical, Inc., Menlo Park, CA (US)

( * ) Notice: Subject to any disclaimer, the term of this patent is extended or adjusted under 35 U.S.C. 154(b) by 97 days.

(21) Appl. No.: 13/471,341

(22) Filed: May 14, 2012

(65) Prior Publication Data

US 2013/0301046 A1    Nov. 14, 2013

(51) Int. Cl.  
*G01J 3/28* (2006.01)

(52) U.S. Cl.  
USPC ......................................... 356/326

(58) Field of Classification Search  
USPC .............. 356/300, 326–328; 250/206, 208.1  
See application file for complete search history.

(56) References Cited

U.S. PATENT DOCUMENTS

| 6,373,573 | B1 | 4/2002 | Jung et al. |
| 6,505,775 | B1 | 1/2003 | Gu et al. |
| 6,583,879 | B1 | 6/2003 | Berg et al. |
| 6,661,509 | B2 * | 12/2003 | Deck et al. ................... 356/301 |
| 6,932,809 | B2 | 8/2005 | Sinofsky |
| 2007/0188752 | A1 * | 8/2007 | Carr et al. ................... 356/326 |
| 2012/0018829 | A1 | 1/2012 | Beck et al. |

FOREIGN PATENT DOCUMENTS

WO    WO 2010/146588 A2    12/2010

OTHER PUBLICATIONS

PCT International Search Report and Written Opinion, PCT Application No. PCT/US2013/040794, Sep. 13, 2013, 20 pages.

* cited by examiner

*Primary Examiner* — Abdullahi Nur  
(74) *Attorney, Agent, or Firm* — Fenwick & West LLP

(57) ABSTRACT

Various systems and methods of monitoring laser safety by sensing contact of the system with a sample are provided. The system includes a focusing element for focusing an incident light from a laser light source onto a sample, an optical element having a collection zone for collecting a signal from the sample, a reflected light sensor for sensing a reflected light from the sample, wherein the reflected light sensor is located outside the collection zone of the optical element and on an inner surface of a housing of the system, an electrical circuit operably connected to the reflected light sensor and the laser light source and configured to control power to the laser light source in accordance with the reflected light sensed by the reflected light sensor and a spectral analyzer for processing the signal. Methods and other systems are also described and illustrated.

22 Claims, 10 Drawing Sheets

SYSTEMS HAVING A REFLECTED LIGHT SENSOR AND METHODS OF USE

BACKGROUND

This invention relates generally to methods and systems to monitor laser safety and to extend battery usage in a medical device. More particularly, the invention relates to methods and systems using a reflected light sensor in a medical device to ensure eye safety and/or to control signal sampling rate such that battery life may be extended.

Systems having one or more lasers are used in a variety of applications, including industrial and medical applications. For example, devices with lasers are used as data transmitters in optical networks and are used in surgical devices to treat topical dermatological lesions such as port wine stains, warts or tumors on a patient's skin.

In general, laser-containing devices ensure eye safety by employing a redundant electrical circuit that monitors either the laser current or the laser output through a monitor photodiode. An alternative method to ensure eye safety uses a laser communication system that detects an interfering object in the optical path to shut off the laser or reduce the power of the laser to a safe level. Yet another method employed in surgical devices used to treat skin legions deactivates the laser if no solid surface is within about 6 to about 12 inches from the radiating tip of the laser hand piece. Existing laser safety systems, however, are large in size and typically do not use components that perform multiple functions.

SUMMARY

These and other limitations are addressed by the present invention, which discloses methods and systems for monitoring laser safety by sensing contact of the system with a sample. In an embodiment, there is provided a method in which laser safety is monitored with a spectrometer having a focusing element, an optical element, a reflected light sensor, an electrical circuit operably connected to the reflected light sensor and a laser light source and configured to control power to the laser light source in accordance with a reflected light sensed by the reflected light sensor, and a spectral analyzer for processing a signal from the sample, the method comprising focusing an incident light from the laser light source onto a sample with the focusing element; collecting a signal from the sample in a collection zone of the optical element; sensing a reflected light from the sample with the reflected light sensor, wherein the reflected light sensor is located outside the collection zone of the optical element and on an inner surface of a housing of the spectrometer; and deactivating the laser light source when the reflected light sensor fails to sense the reflected light from the sample.

The present invention also discloses methods and systems for controlling signal sampling rate as a function of activity. In an embodiment, there is provided a method in which a signal sampling rate is controlled with a system having an optical element, a reflected light sensor and an electrical circuit operably connected to the reflected light sensor and a light source and configured to control the signal sample rate in accordance with the reflected light sensed by the reflected light sensor, the method comprising focusing an incident light from the light source onto a sample; collecting a signal from the sample in a collection zone of the optical element; sensing a reflected light from the sample with the reflected light sensor, wherein the reflected light sensor is located outside the collection zone of the optical element; and controlling a signal sampling rate in accordance with the reflected light sensor sensing a variability in the reflected light from the sample.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Embodiments of the present invention are directed to methods and systems for monitoring laser safety by sensing contact of the system with a sample. Such methods and systems may mitigate risk from inadvertent eye exposure to laser radiation by turning off the laser when the system is not in direct contact with or in close proximity to the sample. Other embodiments of the present invention are directed to methods and systems for controlling signal sampling rate as a function of activity. Such methods and systems may extend the battery life of the system by reducing the signal sampling rate during periods of inactivity.

The systems of embodiments of the present invention use miniaturized components, resulting in a compact device. At least one of the miniaturized components may perform more than one function. For example, a reflected light sensor may be used in a system to monitor laser safety and for controlling signal sampling rate as a function of activity.

Figure 1A:
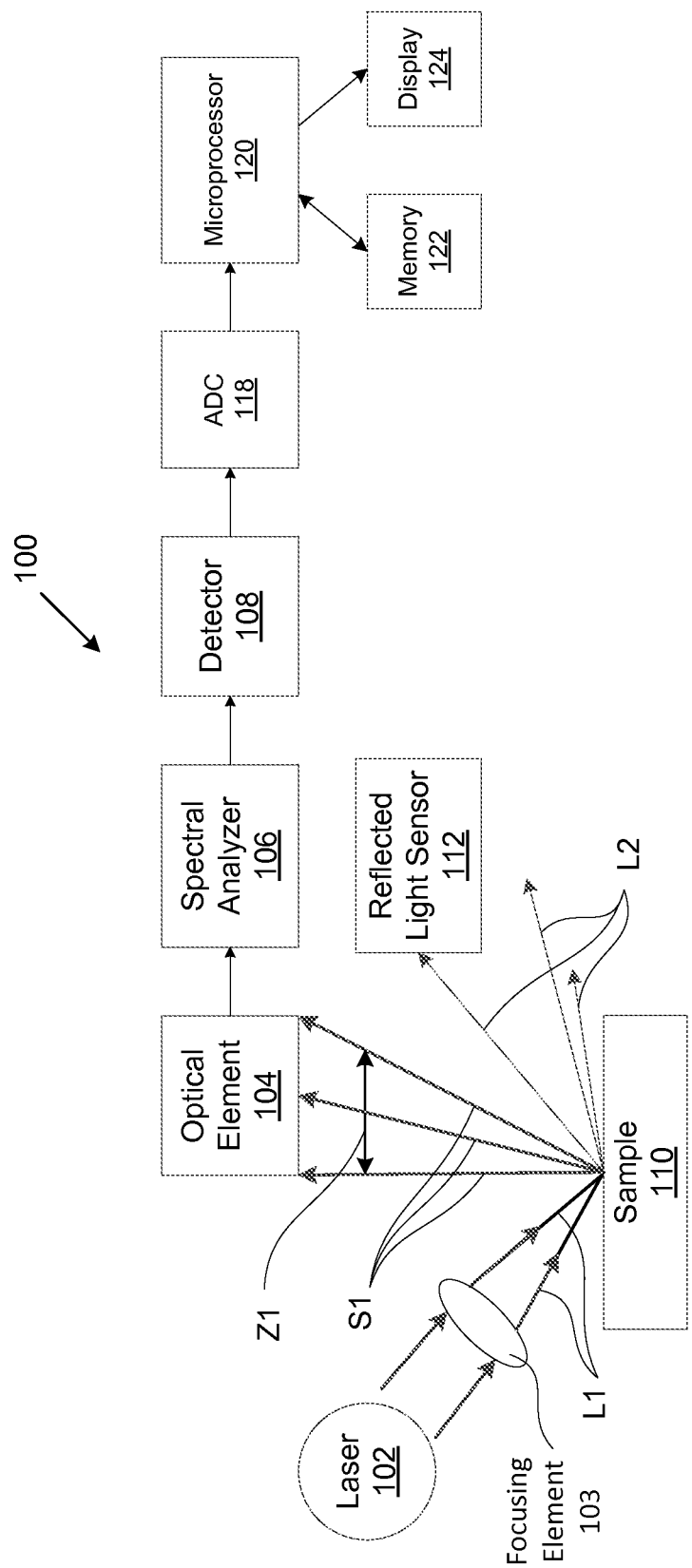
FIG. 1A is a block diagram of a spectrometer, in accordance with an embodiment of the invention.

Referring to FIG. 1A, a spectrometer 100 for monitoring laser light safety and activity (or movement) is illustrated. In an embodiment, the spectrometer 100 is used to noninvasively measure an analyte concentration from a sample (e.g., tissue or skin) that is in direct contact with or is in close proximity to the spectrometer 100. The spectrometer 100 includes a laser light source 102, a focusing element 103, an optical element 104, a spectral analyzer 106, a detector 108, and a reflected light sensor 112. The laser light source 102 provides light in the near-infrared wavelength range of 700 nanometers to 1700 nanometers. In an embodiment, the laser light source 102 is a diode laser. An incident light L1 from the laser light source 102 is focused onto a sample 110 with the focusing element 103 (e.g., a lens, mirror and/or one or more filters). A portion of the incident light L1 is absorbed by the sample 110 and a portion is reflected by the sample 110. The portion reflected by the sample 110 includes a signal S1 that is collected in a collection zone Z1 by the optical element 104 and a reflected light L2 that is outside the collection zone Z1 and is sensed by the reflected light sensor 112. The signal S1 may include a signal from an analyte of interest. In an embodiment, the signal S1 includes a Raman signal from the analyte of interest.

The optical element 104 may include one or more filters, lenses and/or mirrors. In an embodiment, the optical element 104 is a parabolic mirror. The use of a parabolic mirror to collect the signal S1 from the sample contributes to the compact size of the spectrometer 100.

Figure 1B:
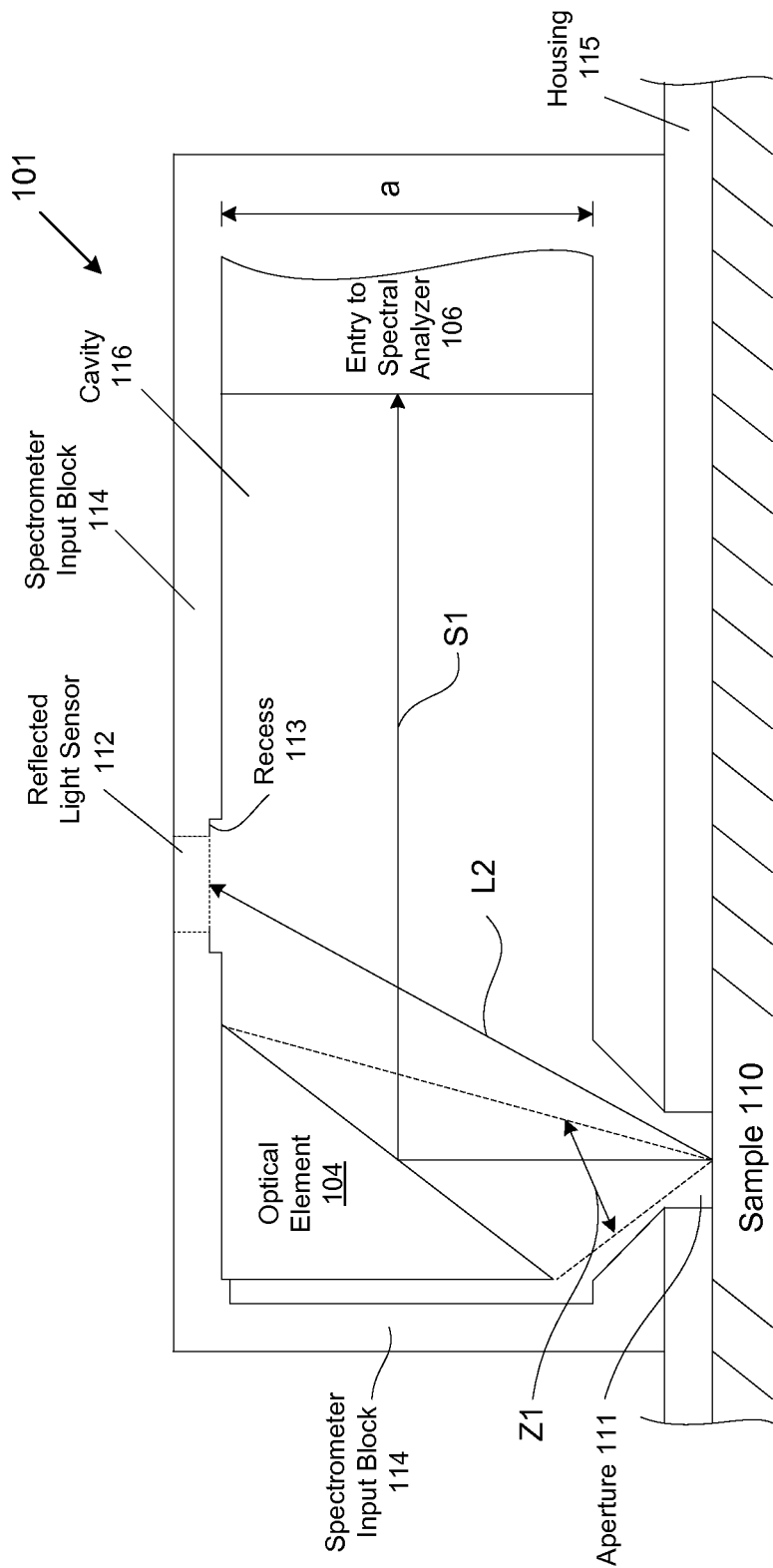
FIG. 1B is a schematic of a front end of a spectrometer, in accordance with an embodiment of the invention.

Referring to FIG. 1B, in an embodiment, the reflected light sensor 112 is adjacent to the optical element 104 and is located in/on an inner surface (e.g., in a recess 113) in a spectrometer input block 114 inside a housing 115 of the spectrometer 100. The reflected light sensor 112 may be directly or indirectly attached to the spectrometer block 114 by, for example, adhesive or through an electrical connector such as a cable with a suitable end for mating the reflected light sensor 112 with the electronics of the spectrometer 100. In an embodiment, the reflected light sensor 112 is located in a front end 101 of the spectrometer 100, the front end 101 having a volume no larger than 250, 200 or 150 cubic millimeters. The location and small size of the reflected light sensor 112 advantageously contributes to the compact size of the spectrometer 100. In an embodiment, the reflected light sensor 112 is a photodiode.

FIGS. 1A and 1B illustrate an embodiment in which the incident light L1 striking the sample travels on a different optical path than that of the signal S1 collected by the optical element 104. In another embodiment, the incident light L1 focused onto the sample 110 and the signal S1 collected from the sample 110 follow the same optical path. In this embodiment, the optical element 104 performs at least two functions: focusing incident light L1 from the laser light source 102 through an aperture 111 and onto the sample 110, and collecting the signal S1 from the sample 110. Use of the optical element 104 to perform both the focusing and collecting functions contributes to the compact size of the spectrometer 100. In an embodiment, the aperture 111 may be an optical window formed from sapphire, magnesium fluoride or diamond.

Referring again to FIG. 1B, the signal S1 collected by the optical element 104 travels through a cavity 116 having a diameter d no larger than 9, 7 or 5 millimeters. After traveling through the cavity 116, the signal S1 is transferred to the spectral analyzer 106 that processes the signal S1 (i.e., separates the signal S1 by wavelength) prior to the signal S1 being detected by the detector 108. In an embodiment, the spectral analyzer 106 includes a diffraction grating.

As illustrated in FIG. 1A, the detector 108, e.g., a photodiode array or a CCD image sensor, captures light from the spectral analyzer 106 and outputs an analog signal. The analog signal from the detector 108 is digitized by an analog-to-digital converter 118. The digitized signal is processed by a microprocessor 120 to obtain an analyte concentration value which is stored in a memory 122 and which may be displayed on an optional display 124. The spectrometer 100 may also include an optional wireless transceiver (not shown) for transmitting data over a wireless network to a remote device so that analyte concentration values may be displayed on the remote device. Exemplary remote devices include a cell phone, a smart phone, a personal digital assistant and/or a computer.

Figure 2:
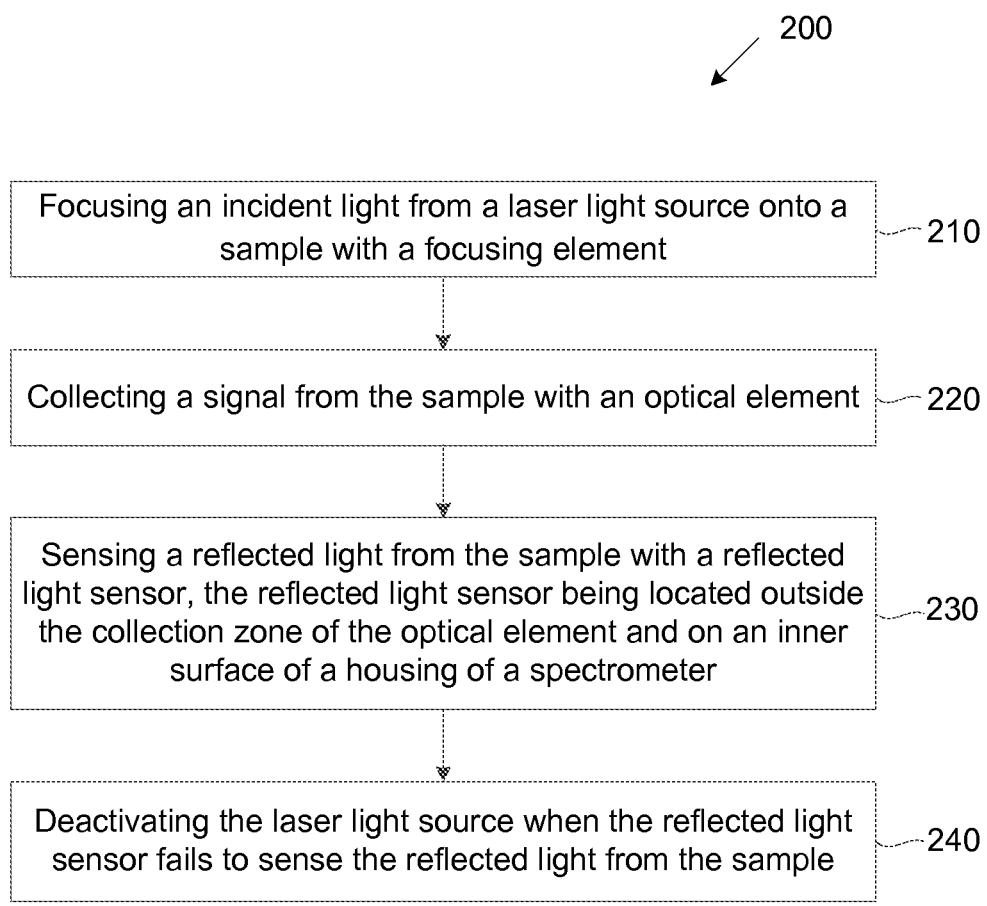
FIG. 2 is a flow chart of a method to monitor laser safety, in accordance with an embodiment of the invention.

The reflected light L2 sensed by the reflected light sensor 112 may be used to control power to the laser light source 102 and/or to control a signal sampling rate. Referring to FIG. 2, a method 200 for monitoring laser safety will now be described. The method 200, for example, may be executed with the aforementioned spectrometer 100 and an electrical circuit illustrated in FIG. 3.

In exemplary step 210, an incident light L1 from a laser light source 102 is focused onto a sample 110 with a focusing element 103. In exemplary step 220, a signal S1 from the sample 110 is collected in a collection zone Z1 with an optical element 104. In an embodiment, the signal S1 includes an analyte signal (e.g., a glucose).

Figure 3:
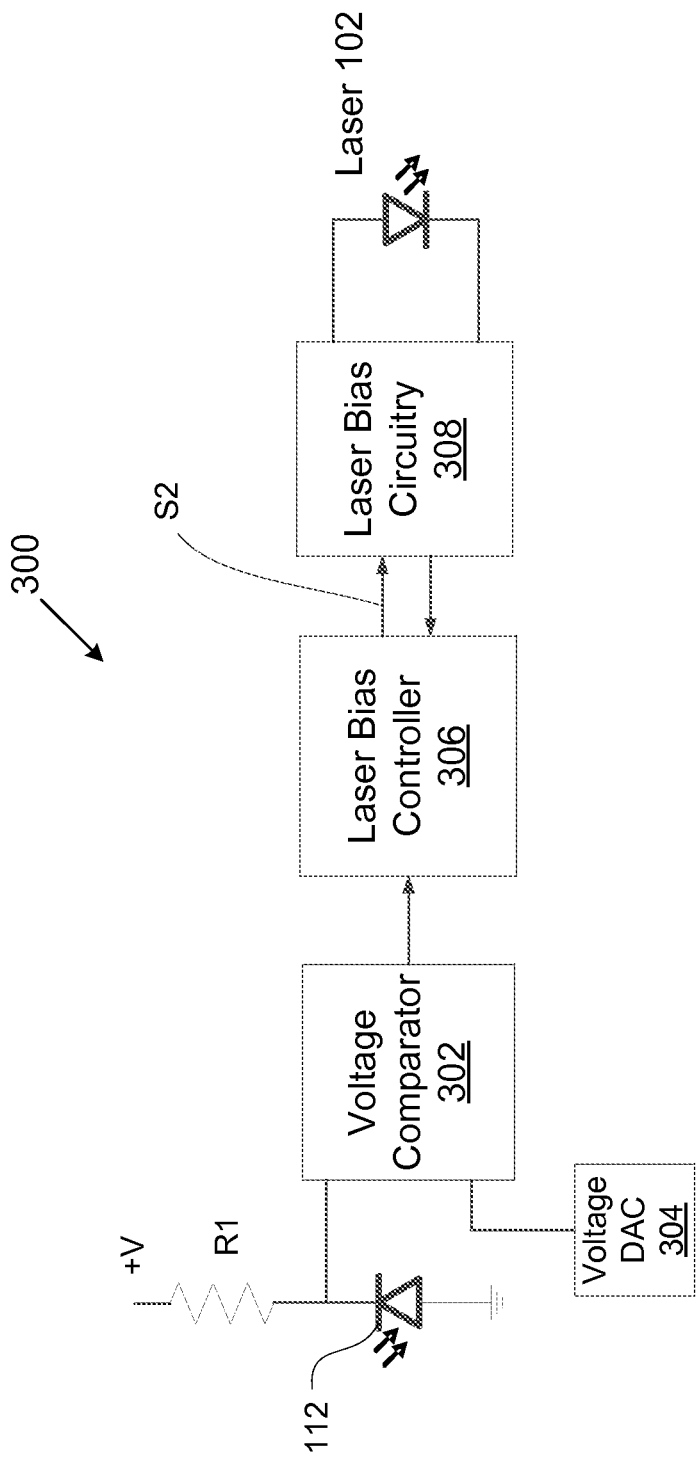
FIG. 3 is a block diagram of an electrical circuit, in accordance with an embodiment of the invention.

In exemplary step 230, when the spectrometer 100 is in direct contact with or in close proximity to the sample 110, a reflected light L2 is sensed by a reflected light sensor 112 located outside the collection zone Z1 of the optical element 102 and in a recess 113 of a spectrometer input block 114. In various embodiments, the reflected light sensor 112 senses reflected light L2 when an outer surface of the spectrometer 100 is no more than ten, five, or one millimeter away from a sample surface The reflected light L2 sensed by the reflected light sensor 112 may be converted to current or voltage and may be sent to a laser safety circuit 300 illustrated in FIG. 3. In an embodiment, a fixed or a variable threshold value (e.g., a fixed or variable voltage value) outputted from the reflected light sensor 112 may be used to trigger laser shut off. An embodiment using a variable threshold voltage value to trigger laser shut off is shown in FIG. 3. The embodiment in FIG. 3 includes a photodiode as the reflected light sensor 112, a voltage comparator 302, a voltage DAC 304, a laser bias controller 306 that controls a laser bias circuitry 308 and the laser 102. The reflected light L2 collected by the photodiode 112 is converted to a current value which is converted to a voltage value through a resistor R1. The voltage value is inputted to the voltage comparator 302. When the voltage value passes a pre-determined threshold, then the output from the voltage comparator 302 changes state. The threshold can be adjusted by the voltage DAC 304. When the reflected light L2 is high, the output from the voltage comparator 302 is low. When the reflected light L2 is low, the output from the voltage comparator 302 is high, causing the laser bias controller 306 to send a shutdown signal S2 through the laser bias circuitry 308 to the laser 102. In embodiments, the laser bias controller 306 may be a Field Programmable Gate Array (FPGA), a microprocessor or a logic circuitry. In an embodiment, the FPGA 306 may apply additional criteria to turn off the laser 102. In an embodiment, if the output from the voltage comparator 302 is "high" for more than 10 microseconds, then the FPGA 306 shuts down the laser bias circuitry 308, shutting down the laser 102. Other embodiments using various circuitry configurations may be envisioned by those skilled in the art.

Referring back to FIG. 2, in exemplary step 240, the laser light source 102 is deactivated when the reflected light sensor 112 fails to sense the reflected light L2 from the sample 110. An optional alarm may also be triggered and/or an error message may be displayed. In different embodiments, the laser light source is deactivated if the spectrometer 100 is not in close proximity to the sample 110, i.e., the distance between the outside of the housing 115 of the spectrometer 100 and the sample 110 is more than ten, five, or one millimeter. The distance between the spectrometer 100 and the sample 110 may be determined as a function of the amount of light received at the reflected light sensor 112 (e.g., as interpreted by the circuit described with respect to FIG. 3 above).

In another embodiment, a combination of signals from the reflected light sensor 112 and a CCD detector 108 may be used to determine if the spectrometer is in close proximity to the sample 110 and if a sample signature is detected to automatically start an analyte signal measurement. In an embodiment, a threshold voltage value from the reflected light sensor 112 used to trigger analyte signal measurement may be different than the threshold voltage value from the reflected light sensor 112 used to trigger laser shut down.

Figure 4:
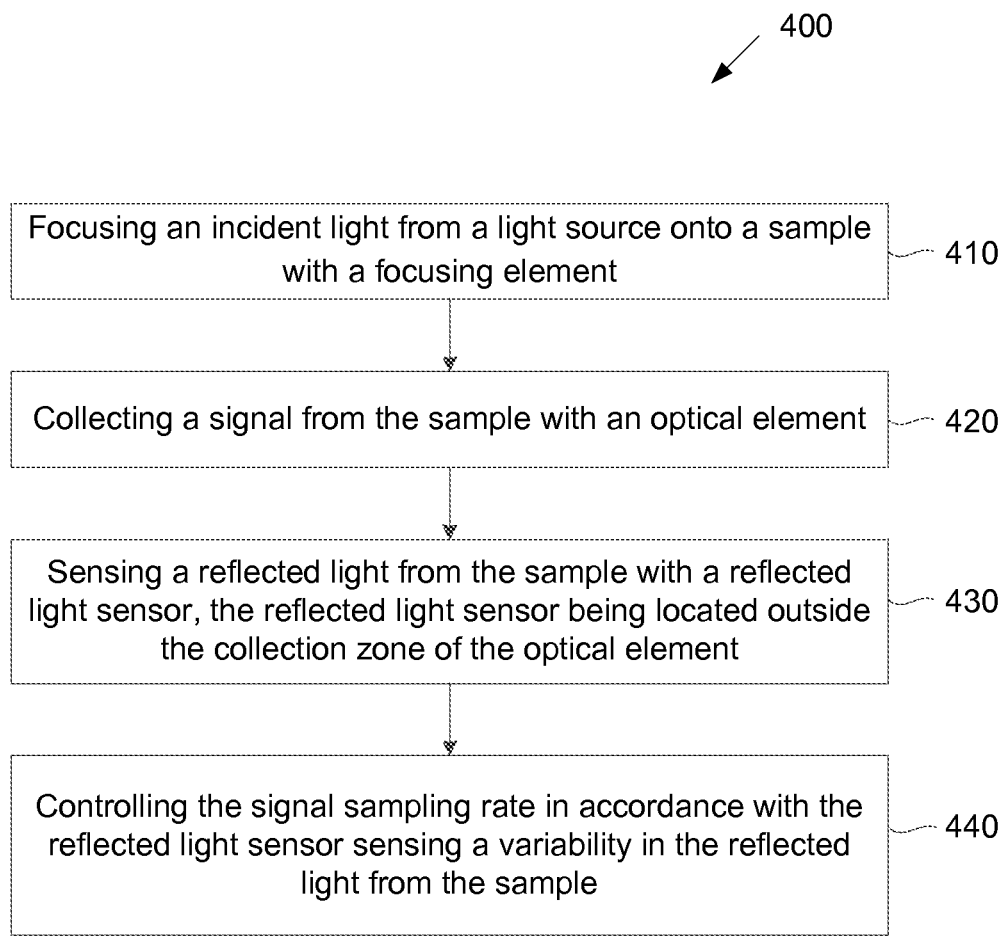
FIG. 4 is a flow chart of a method to control a signal sampling rate, in accordance with an embodiment of the invention.

Referring to FIG. 4, a method 400 for controlling signal sampling rate will now be described. The method 400, for example, may be executed with the aforementioned spectrometer 100 and an electrical circuit illustrated in FIG. 5.

In exemplary step 410, an incident light L1 from a laser light source 102 is focused onto a sample 110 with a focusing element 103. In an embodiment, the laser light source 102 is replaced with a light source including, for example, one or more light-emitting diodes, a gas discharge lamp or a high-intensity discharge lamp. Exemplary gas discharge lamps include fluorescent, induction, hollow cathode, neon, argon, plasma and xenon flash lamps. Exemplary high-intensity discharge lamps include carbon arc, ceramic discharge metal halide, hydrargyrum medium-arc iodide, mercury-vapor, metal halide, sodium vapor, sulfur and xenon arc lamps.

In exemplary step 420, a signal S1 from the sample 110 is collected in a collection zone Z1 with an optical element 104. In an embodiment, the signal S1 includes an analyte signal (e.g., a glucose concentration in the sample).

In exemplary step 430, when the spectrometer 100 is in direct contact with or is in close proximity to the sample 110, a reflected light L2 is sensed by a reflected light sensor 112 located outside the collection zone Z1 of the optical element 102 and is in a recess 113 of a spectrometer input block 114. In different embodiments, the reflected light sensor 112 senses reflected light L2 when an outer surface of the housing 115 of the spectrometer 100 is no more than ten, five, or one millimeters away from a sample surface. The distance between the spectrometer 100 and the sample surface may be determined as a function of the amount of light received at the reflected light sensor 112 (e.g., as interpreted by the circuit described with respect to FIG. 5 below).

Figure 5:
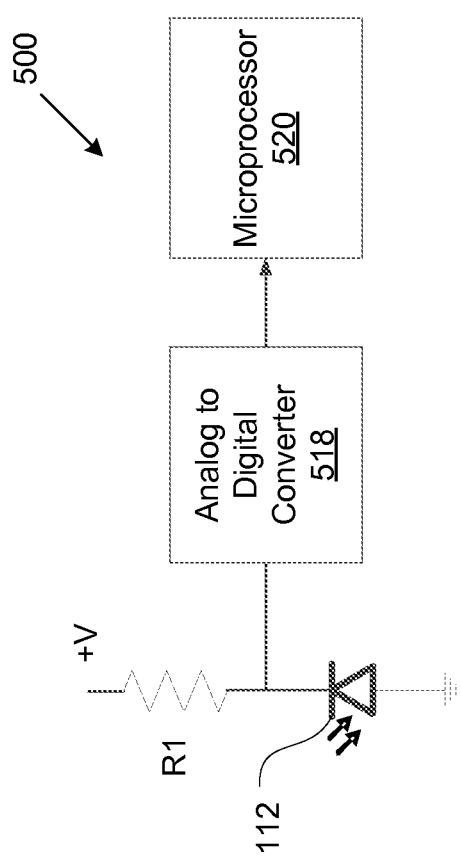
FIG. 5 is a block diagram of another electrical circuit, in accordance with an embodiment of the invention.

The reflected light L2 sensed by the reflected light sensor 112 (e.g., a photodiode) may be digitized for further processing by a microprocessor 520, as illustrated in FIG. 5. For example, voltage outputted from the reflected light sensor 112 may be converted to a digital value ("counts") with an analog-to-digital converter 518. These voltages and counts may, for example, be used to determine a variability in the reflected light L2 sensed by the reflected light sensor 112.

In exemplary step 440, the signal sampling rate is controlled in accordance with the reflected light sensor 112 sensing a variability in the reflected light L2 from the sample 110. As a user of the spectrometer 100 performs an activity (e.g., moves, eats, etc.), an increase in a count variability will be sensed by the reflected light sensor 112. If, however, the spectrometer 100 user is inactive (e.g., is sleeping or resting), little variability in the counts will be sensed by the reflected light sensor 112. A threshold level of count variability may be used as a basis for a signal sampling rate: if the count variability is below a threshold level, then the signal sampling rate may be decreased by the microprocessor 520 and the device battery life may be extended. Exemplary methods to determine count variability include determining a moving average of the count variability, determining a rate of change in counts and/or determining a standard deviation in count variability.

Figure 6:
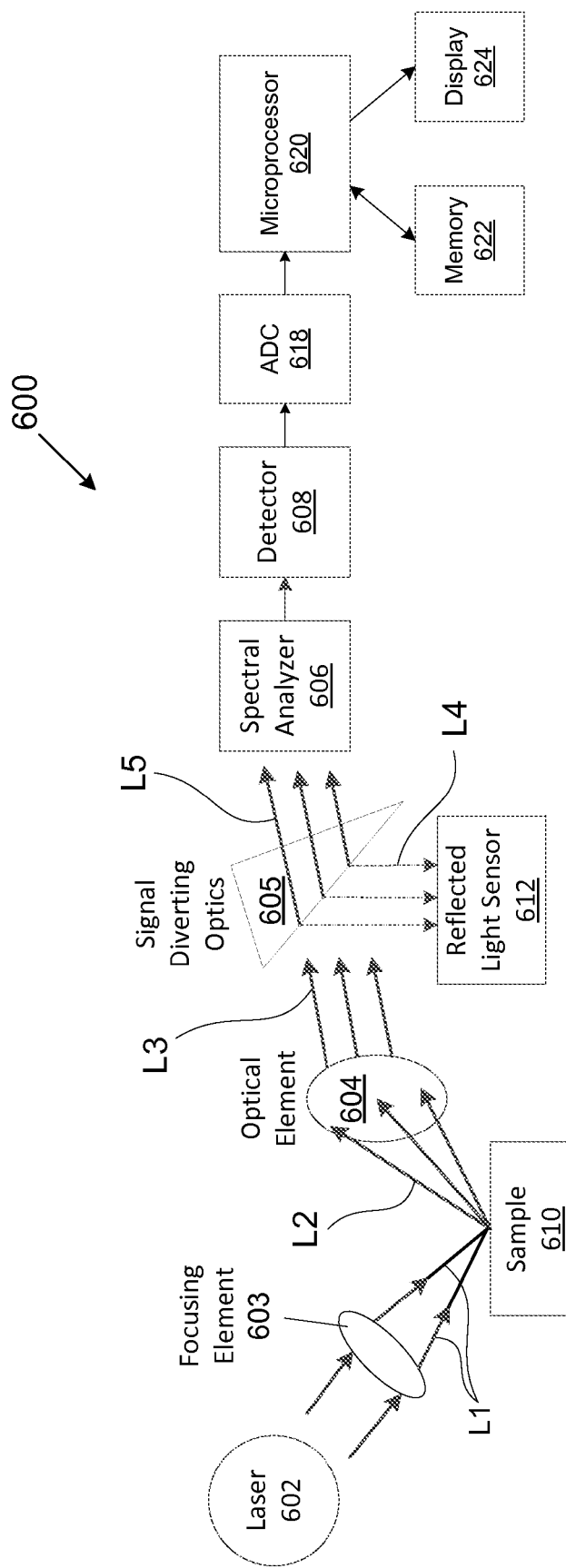
FIG. 6 is a block diagram of a spectrometer, in accordance with another embodiment of the invention.

Referring to FIG. 6, another exemplary embodiment of a spectrometer 600 for monitoring laser light safety is illustrated and will now be described. In an embodiment, the spectrometer 600 is used to noninvasively measure an analyte concentration from a sample (e.g., tissue or skin) that is in direct contact with or is in close proximity to the spectrometer 600. The spectrometer 600 includes a laser light source 602, a focusing element 603, an optical element 604, a signal diverting optics 605, a spectral analyzer 606, a detector 608, and a reflected light sensor 612. The laser light source 602 provides light in the near-infrared wavelength range of 700 nanometers to 1700 nanometers. In an embodiment, the laser light source 602 is a diode laser. An incident light L1 from the laser light source 602 is focused onto a sample 610 (e.g., tissue or skin) with the focusing element 603. The incident light L1 strikes the sample 610 and a portion is reflected by the sample 610. The portion reflected by the sample 610 includes a reflected light L2 that is collected by the optical element 604. The reflected light L2 may include a Raman signal from an analyte of interest.

The optical element 604 transfers a collected light L3 to the signal diverting optics 605 which may, for example, be a beam splitter. The signal diverting optics 605 diverts a small amount of the collected light L3 (i.e., a diverted light L4) onto the reflected light sensor 612. In an embodiment, the diverted light L4 includes 1 percent to 10 percent of the collected light L3 from the optical element 604. The use of the signal diverting optics 605 contributes to the compact size of the spectrometer 100.

In various embodiments, the reflected light sensor 612 is located in a front end of the spectrometer 600, the front end having a volume no larger than 25, 20, or 15 cubic millimeters. In an embodiment, the reflected light sensor 612 is a photodiode.

Ninety percent to ninety-nine percent of the collected light L3 (i.e., an attenuated light L5) travels through the signal diverting optics 605 and enters the spectral analyzer 606. The spectral analyzer 606 separates the attenuated light L5 by wavelength prior to the attenuated light L5 being detected by the detector 608. In an embodiment, the spectral analyzer 606 includes a diffraction grating.

The detector 608, e.g., a photodiode array or a CCD image sensor, captures light from the spectral analyzer 606 and outputs an analog signal. The analog signal from the detector 608 is digitized by an analog-to-digital converter 618. The digitized signal is processed by a microprocessor 620 to obtain an analyte concentration value which is stored in a memory 622 and which may be displayed on an optional display 624. The spectrometer 600 may also include an optional wireless transceiver (not shown) for transmitting data over a wireless network to a remote device so that analyte concentration values may be displayed on the remote device. Exemplary remote devices include a cell phone, a smart phone, a personal digital assistant and/or a computer.

Figure 7:
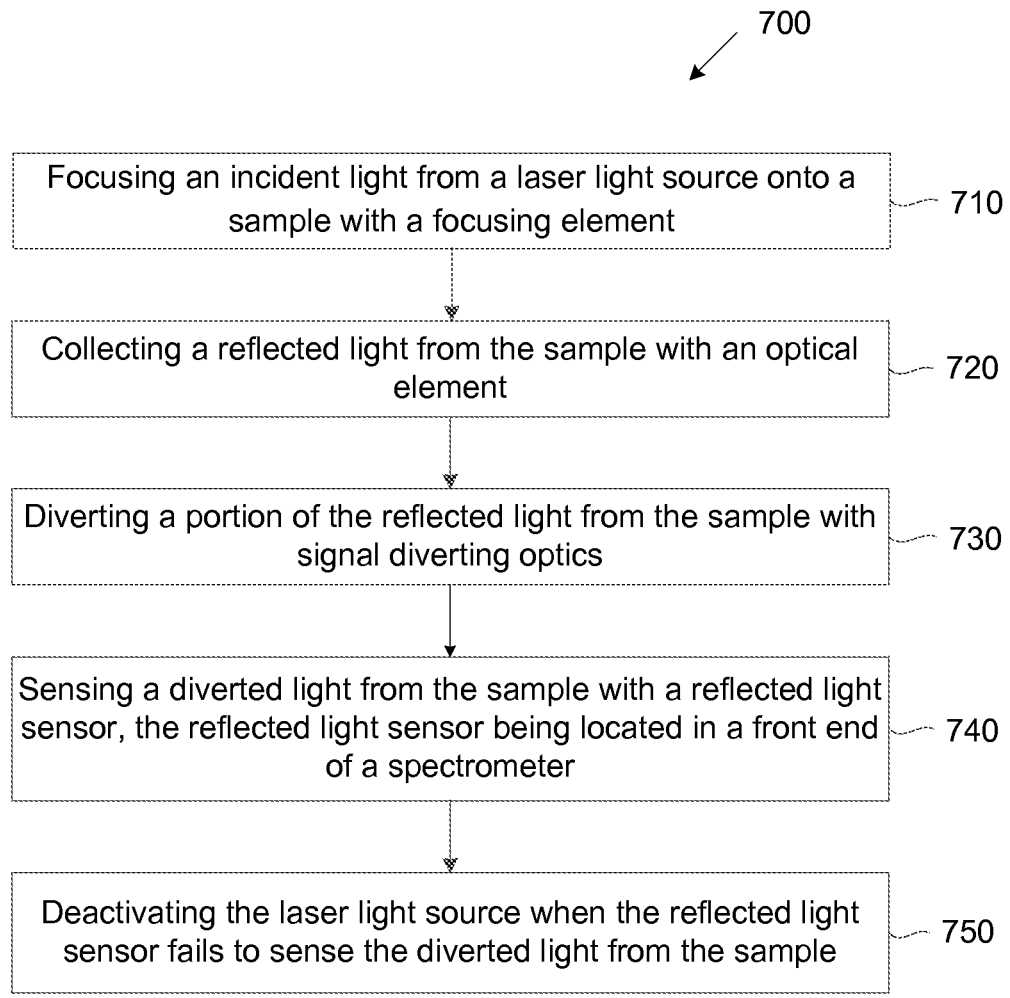
FIG. 7 is a flow chart of a method to monitor laser safety, in accordance with another embodiment of the invention.

The diverted light L4 sensed by the reflected light sensor 612 may be used to control power to the laser light source 602. Referring to FIG. 7, a method 700 for monitoring laser safety will now be described. The method 700, for example, may be executed with the aforementioned spectrometer 600 and the electrical circuit 300 illustrated in FIG. 3.

In exemplary step 710, an incident light L1 from a laser light source 602 is focused onto a sample 610 with a focusing element 603. In exemplary step 720, substantially all of a reflected light L2 from the sample 610 is collected with an optical element 604. In an embodiment, the reflected light L2 includes an analyte signal (e.g., a glucose concentration in the sample).

In exemplary step 730, when the spectrometer 600 is in direct contact with or is in close proximity to the sample 610, a small amount of a collected light L3 from the optical element 604 is diverted by a signal diverting optics 605.

In exemplary step 740, a diverted light L4 is sensed by a reflected light sensor 612 located in a front end of the spectrometer 600. The diverted light L4 sensed by the reflected light sensor 612 may be converted to current or voltage and may be sent to a laser safety circuit 300 as described previously with reference to FIG. 3. In various embodiments, the reflected light sensor 612 senses diverted light L4 when an outer surface of the spectrometer 600 is no more than ten, five, or one millimeter away from a sample surface. The distance between the spectrometer 600 and the sample surface may be determined as a function of the amount of light received at the reflected light sensor 612. In various embodiments, the reflected light sensor 112 is located in a front end of the spectrometer 600 having a volume no larger than 250, 200, or 150 cubic millimeters.

In exemplary step 750, the laser light source 602 is deactivated when the diverted light L4 sensed by the reflected light sensor 612 falls below a threshold value. An optional alarm may also be triggered and/or an error message may be displayed. In an embodiment, the laser light source 602 is deactivated if the spectrometer 600 is not in close proximity to the sample 610, i.e., the distance between the spectrometer 600 and the sample 610 is more than ten, five, or one millimeter.

Figure 8:
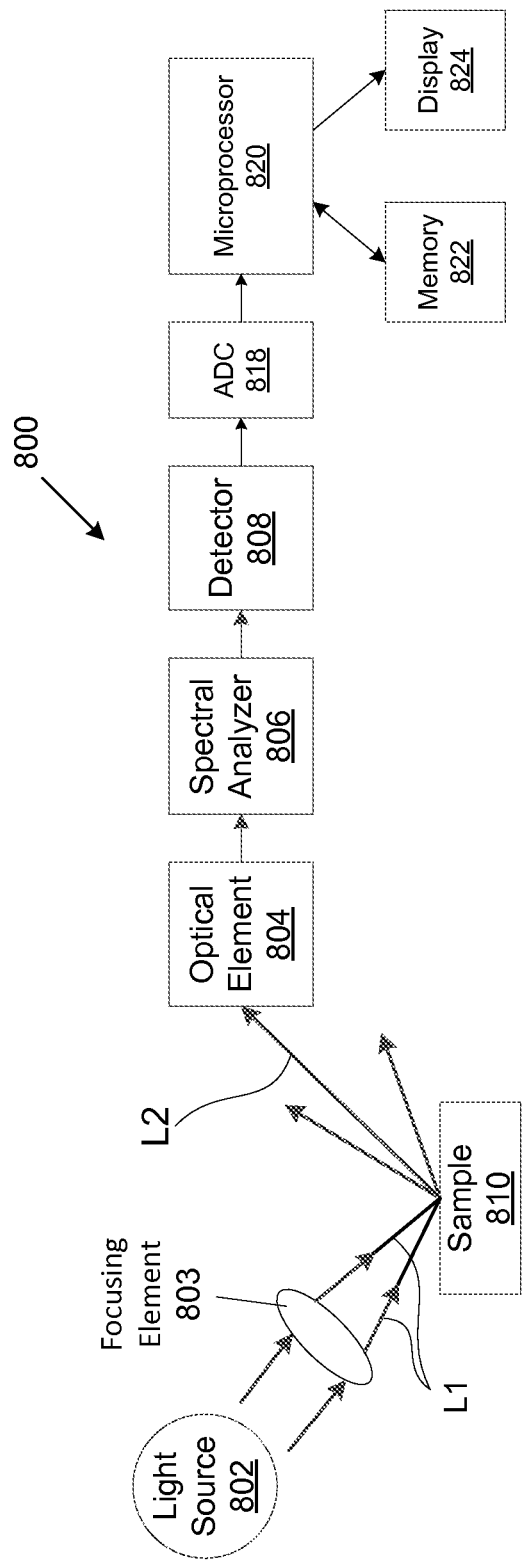
FIG. 8 is a block diagram of a system, in accordance with an embodiment of the invention.

Referring to FIG. 8, an exemplary embodiment of a system 800 for controlling signal sampling rate is illustrated and will now be described.

A system 800 for monitoring activity (or movement) is illustrated in FIG. 8. In an embodiment, the system 800 is used to noninvasively measure an analyte concentration from a sample (e.g., tissue or skin) that is in direct contact with or is in close proximity to the system 800. The system 800 includes a light source 802, a focusing element 803, an optical element 804, a spectral analyzer 806 and a detector 808.

In the embodiment shown in FIG. 8, the detector 808 performs the same function as the previously described reflected light sensor 112 illustrated in FIG. 1, i.e., the detector 808 detects variability in the reflected light L2 from the sample 810.

An incident light L1 from the light source 802 is focused onto a sample 810 (e.g., tissue or skin) with the focusing element 803. A portion of the incident light L1 is absorbed by the sample 810 and a portion of the reflected light L1 is reflected by the sample 810. The portion reflected by the sample 810 includes a reflected light L2 that is collected by the optical element 804. The reflected light L2 may include a Raman signal from an analyte of interest.

In an embodiment, the light source 802 provides light in the near-infrared wavelength range of 700 nanometers to 1700 nanometers. Exemplary light sources 802 include a diode laser, one or more light-emitting diodes, a gas discharge lamp or a high-intensity discharge lamp. Exemplary gas discharge lamps include fluorescent, induction, hollow cathode, neon, argon, plasma and xenon flash lamps. Exemplary high-intensity discharge lamps include carbon arc, ceramic discharge metal halide, hydrargyrum medium-arc iodide, mercury-vapor, metal halide, sodium vapor, sulfur and xenon arc lamps.

The reflected light L2 collected by the optical element 804 is transferred to the spectral analyzer 806 that processes the reflected light L2 (i.e., separates the reflected light L2 by wavelength) prior to the reflected light L2 being detected by the detector 808. In an embodiment, the spectral analyzer 806 includes a diffraction grating.

The detector 808, e.g., a photodiode array or a CCD image sensor, detects light from the spectral analyzer 806 and outputs an analog signal. The analog signal from the detector 808 is digitized by an analog-to-digital converter 818. The digitized signal is processed by a microprocessor 820 to obtain an analyte concentration value which is stored in a memory 822 and which may be displayed on an optional display 824. Based on the variability of the digitized signal, the microprocessor 820 controls a signal sampling rate, as will be described below with reference to FIG. 9. The system 800 may also include an optional wireless transceiver (not shown) for transmitting data over a wireless network to a remote device so that analyte concentration values may be displayed on the remote device. Exemplary remote devices include a cell phone, a smart phone, a smart watch, a personal digital assistant and/or a computer.

Figure 9:
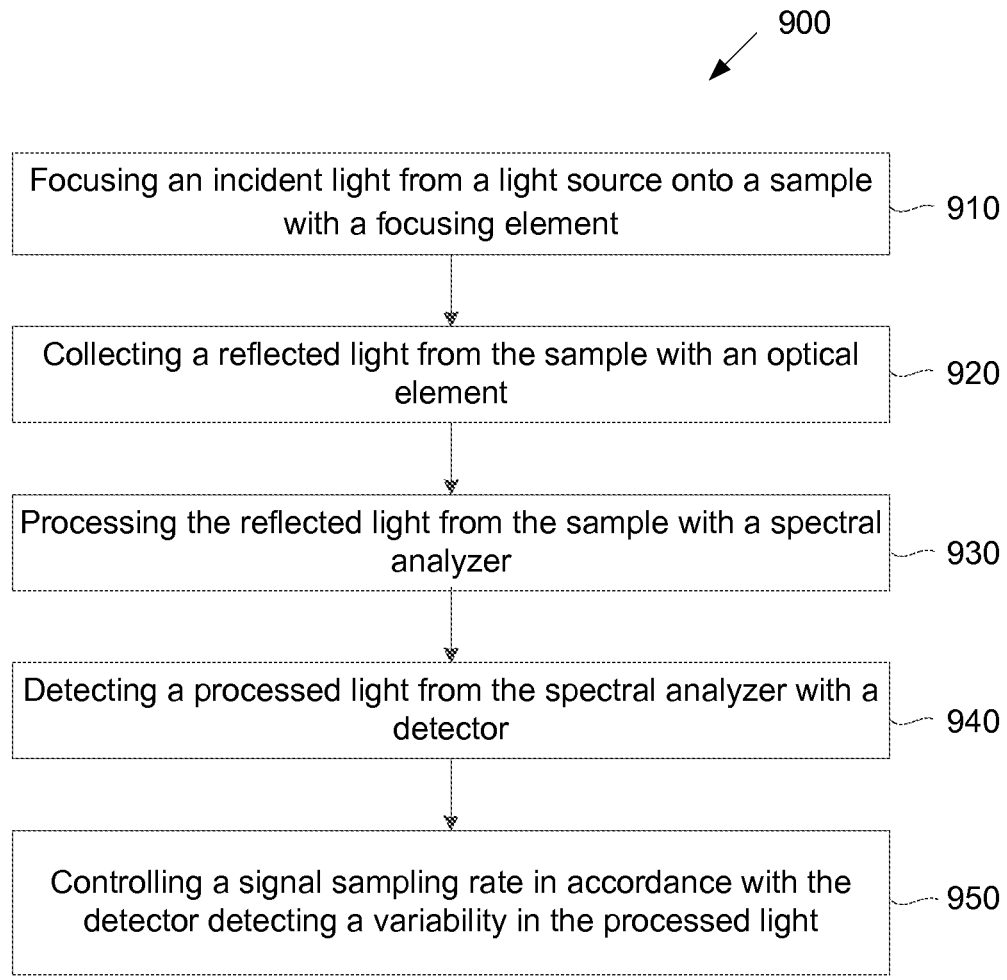
FIG. 9 is a flow chart of a method to control a signal sampling rate, in accordance with an embodiment of the invention.

Referring to FIG. 9, a method 900 for controlling signal sampling rate will now be described. The method 900, for example, may be executed with the aforementioned system 800.

In exemplary step 910, an incident light L1 from a light source 802 is focused onto a sample 810 with a focusing element 803. In exemplary step 920, a reflected light L2 from the sample 810 is collected with an optical element 804. In an embodiment, the reflected light L2 includes an analyte signal (e.g., glucose).

In exemplary step 930, the reflected light L2 collected by the optical element 804 is processed by a spectral analyzer 806.

In exemplary step 940, when the system 800 is in direct contact with or in close proximity to the sample 110, processed light from the spectral analyzer 806 is detected by the detector 808. In various embodiments, processed light from the spectral analyzer 806 is detected when an outer surface of the system 800 is no more than ten, five, or one millimeter away from a sample surface. The light detected by the detector 808 may be converted to a digital value ("count") by an analog-to-digital converter 818, as illustrated in FIG. 8.

In exemplary step 950, the signal sampling rate is controlled in accordance with the detector 808 detecting a variability in the reflected light L2 from the sample 810. As a user of the system 800 performs an activity (e.g., moves, eats, etc.), an increase in a count variability will be detected. If, however, the device user is inactive (e.g., is sleeping or resting), little variability in the counts will be detected. A threshold level of count variability may be used as a basis for a signal sampling rate: if the count variability is below a threshold level, then the signal sampling rate may be decreased by the microprocessor 820 and the device battery life may be extended. Exemplary methods to determine count variability include determining a moving averaging of the count variability, determining a rate of change in counts and/or determining a standard deviation in the count variability.

Where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, may be performed in reverse order when possible and may be performed sequentially as described above.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A spectrometer comprising:
    a focusing element for focusing an incident light from a laser light source onto a sample;
    an optical element having a collection zone for collecting a first reflected light reflected from the sample within the collection zone, but not a second reflected light reflected from the sample outside the collection zone;
    a reflected light sensor for sensing the second reflected light reflected from the sample, wherein the reflected light sensor is positioned outside the collection zone of the optical element and on an inner surface of a housing of the spectrometer, wherein the spectrometer is configured such that the second reflected light is not transmitted or reflected by any optical elements other than an optical window before being sensed by the reflected light sensor;
    an electrical circuit operably connected to the reflected light sensor and the laser light source and configured to control power to the laser light source in accordance with the second reflected light sensed by the reflected light sensor; and
    a spectral analyzer for processing the first reflected light.

2. The spectrometer of claim 1, wherein the reflected light sensor senses the second reflected light when an outer surface of the spectrometer is no more than ten millimeters away from a sample surface.

3. The spectrometer of claim 1, wherein the reflected light sensor is located in a front end of the spectrometer, the front end having a volume no larger than 250 cubic millimeters.

4. The spectrometer of claim 1, wherein the reflected light sensor is located adjacent to the optical element.

5. The spectrometer of claim 1, wherein the optical element is a parabolic mirror.

6. The spectrometer of claim 1, wherein the reflected light sensor is a photodiode.

7. A method of monitoring laser safety, the method comprising:
    focusing an incident light from a laser light source onto a sample with a focusing element;
    collecting a first reflected light reflected from a sample within a collection zone of an optical element but not a second reflected light reflected from the sample outside the collection zone, the second reflected light traveling an entirely different optical path than the first reflected light;
    sensing the second reflected light reflected from the sample with a reflected light sensor, wherein the reflected light sensor is positioned outside the collection zone of the optical element and on an inner surface of a housing of a spectrometer; and
    deactivating the laser light source when the reflected light sensor fails to sense the second reflected light from the sample.

8. The method of claim 7, wherein the sensing of the second reflected light from the sample includes sensing the second reflected light from a sample surface located within ten millimeters of an outer surface of a housing of the spectrometer.

9. A spectrometer comprising:
    a focusing element for focusing an incident light from a laser light source onto a sample;
    an optical element having a collection zone for collecting a first reflected light reflected from the sample within the collection zone, but not a second reflected light reflected from the sample outside the collection zone, the second reflected light traveling an entirely different optical path than the first reflected light;
    a reflected light sensor for sensing the second reflected light from the signal diverting optics, wherein the reflected light sensor is positioned outside the collection zone of the optical element and on an inner surface of a housing of the spectrometer; and
    an electrical circuit operably connected to the reflected light sensor and the laser light source and configured to control power to the laser light source in accordance with the second reflected light sensed by the reflected light sensor; and
    a spectral analyzer for processing the first reflected light.

10. The spectrometer of claim 9, wherein the reflected light sensor senses the second reflected light from a sample when an outer surface of the spectrometer is no more than ten millimeters away from a sample surface.

11. The spectrometer of claim 9, wherein the reflected light sensor is a photodiode.

12. A system for controlling a signal sampling rate, the system comprising:
    a focusing element for focusing an incident light from a light source onto a sample;
    an optical element having a collection zone for collecting a first reflected light reflected from the sample within the collection zone but not a second reflected light reflected from the sample outside the collection zone, the second reflected light traveling an entirely different optical path than the first reflected light;
    a reflected light sensor for sensing the second reflected light collected from the sample, wherein the reflected light sensor is positioned outside the collection zone of the optical element and on an inner surface of a housing of the spectrometer; and
    an electrical circuit operably connected to the reflected light sensor and configured to control a signal sampling rate in accordance with a variability in the second reflected light sensed by the reflected light sensor.

13. The system of claim 12, wherein the reflected light sensor is located adjacent to the optical element.

14. The system of claim 12, wherein the reflected light sensor senses second reflected light from a sample when an outer surface of the system is no more than ten millimeters away from a sample surface.

15. The system of claim 12, wherein the signal sampling rate is reduced responsive to the variability being below a threshold value.

16. The system of claim 12, wherein the variability is a count variability.

17. The system of claim 12, wherein the optical element is a parabolic mirror.

18. The system of claim 12, wherein the reflected light sensor is a photodiode.

19. A method of controlling a signal sampling rate, the method comprising:
    focusing an incident light from a light source onto a sample with a focusing element;
    collecting a first reflected light reflected from the sample within a collection zone of an optical element but not a second reflected light reflected from the sample outside the collection zone, the second reflected light traveling an entirely different optical path than the first reflected light;

sensing the second reflected light from the sample with a reflected light sensor, wherein the reflected light sensor is positioned outside the collection zone of the optical element; and controlling a signal sampling rate in accordance with the reflected light sensor sensing a variability in the second reflected light from the sample.

20. The method of claim 19, wherein the signal sampling rate is reduced responsive to the variability being below a threshold value.

21. The method of claim 19, wherein the variability in the second reflected light is a count variability that may be determined by at least one method selected from a group consisting of determining a moving averaging of a count variability, determining a rate of change in the counts and determining a standard deviation in the count variability.

22. The method of claim 19, wherein the sensing the second reflected light from the sample step includes sensing reflected light from a sample surface located within ten millimeters of an outer surface of a housing of a system.

\* \* \* \* \*